US007120256B2

(12) United States Patent
Grancea et al.

(10) Patent No.: US 7,120,256 B2
(45) Date of Patent: Oct. 10, 2006

(54) AUDIO TESTING SYSTEM AND METHOD

(75) Inventors: Alexandru Grancea, New South Wales (AU); Stephen John Penfold, New South Wales (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 767 days.

(21) Appl. No.: 10/177,407

(22) Filed: Jun. 21, 2002

(65) Prior Publication Data

US 2003/0235311 A1 Dec. 25, 2003

(51) Int. Cl.
*H03G 29/00* (2006.01)

(52) U.S. Cl. ........................................ 381/55; 381/12

(58) Field of Classification Search .................. 381/56, 381/58, 59, 77, 80, 82, 1, 12, 55
See application file for complete search history.

(56) References Cited

U.S. PATENT DOCUMENTS 3,067,297 A * 12/1962 Fink .............................. 381/1
4,374,435 A * 2/1983 Lach et al. .................... 381/58
4,908,868 A * 3/1990 McTaggart ................... 381/59

* cited by examiner

*Primary Examiner*—Ping Lee
(74) *Attorney, Agent, or Firm*—Dov Rosenfeld; Inventek

(57) ABSTRACT

A method is provided for increasing the quality of audio reproduction of a binaural rendering in a passenger environment having a number of seats, each seat having an audio system including a headphone jack for interconnection with a headphone device. The method comprising the steps of: playing predetermined audio tones over the audio system, and interconnecting a testing system to the headphone jack of the seats to monitor the signal received by the headphone jack to determine the audio quality of reproduction of the seat. The invention extends to an audio monitoring device, an audio monitoring system, and a storage medium carrying said audio tones.

5 Claims, 6 Drawing Sheets

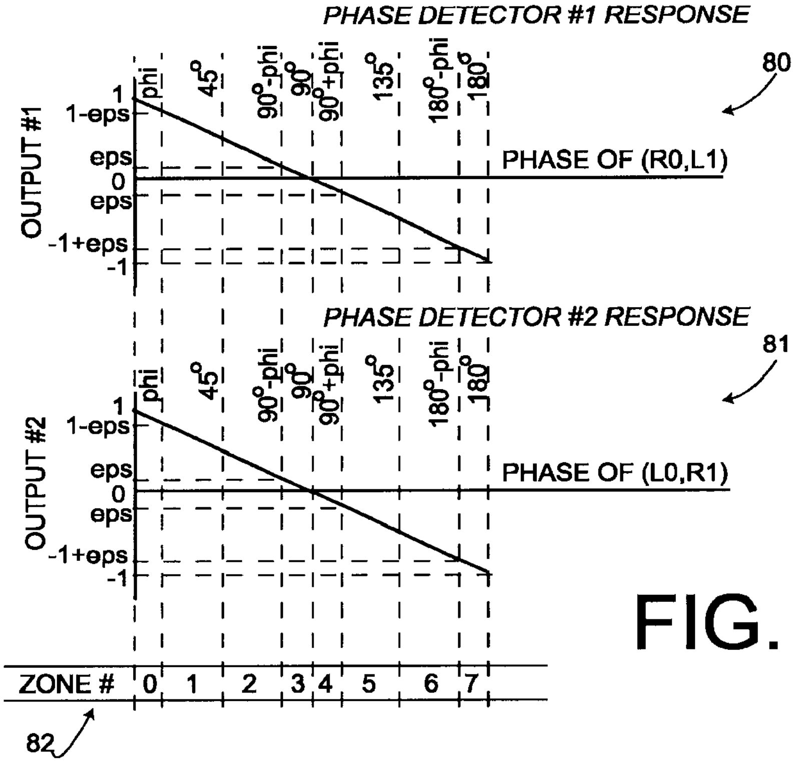

FIG. 8

*RESULT TABLE FOR PHASE RELATED MEASUREMENTS* 92

OUTPUT #1 ZONE

OUTPUT #2 ZONE 91

| | 0 | 1 | 2 | 3 | 4 | 5 | 6 | 7 |
|---|---|---|---|---|---|---|---|---|
| 0 | ERROR | ERROR | ERROR | OK | OK | ERROR | ERROR | ERROR |
| 1 | ERROR | ERROR | PHASE | ERROR | ERROR | PHASE | ERROR | ERROR |
| 2 | ERROR | Phase Swappd | ERROR | ERROR | ERROR | ERROR | Phase Polarty Swappd | ERROR |
| 3 | Swappd | ERROR | ERROR | ERROR | ERROR | ERROR | ERROR | Polarty Swappd |
| 4 | Swappd | ERROR | ERROR | ERROR | ERROR | ERROR | ERROR | Polarty Swappd |
| 5 | ERROR | Phase Swappd | ERROR | ERROR | ERROR | ERROR | Phase Polarty Swappd | ERROR |
| 6 | ERROR | ERROR | Phase Polarty | ERROR | ERROR | Phase Polarty | ERROR | ERROR |
| 7 | ERROR | ERROR | ERROR | Polarty | Polarty | ERROR | ERROR | ERROR |

FIG. 9

AUDIO TESTING SYSTEM AND METHOD

FIELD OF THE INVENTION

The present invention relates to the field of audio testing and, in particular, relates to the audio testing of audio equipment supplied in a passenger seat forming part of a passenger environment such as an aeroplane or the like.

BACKGROUND OF THE INVENTION

It is common to provide for an audio listening experience in modern commercial airliners and passenger trains or the like. The airline listening experience normally comprises playing a multi-channel video tape or providing audio music which is streamed to each airline seat for selection by passengers listening to the audio output utilising a headphone plugged into the headphone jack of the audio system formed within each passenger's seat.

It is often desirable to provide for a high quality audio listening experience in airlines. This is particularly the case with the recent introduction of high quality headphone audio formats such as the Dolby Headphone (Trade Mark) audio format which provides for extensive pre-processing of the audio signals for rendering over stereo headphone devices. With a high end audio format, it is desirable to ensure that the headphone output of each passenger seat is of a sufficient quality so as to bring out the attributes of the high quality audio format.

SUMMARY OF THE INVENTION

It is an object of the present invention to provide for an improved form of testing of multi-channel audio transducer outputs, such as headphone outputs, in a multi-listener environment, such as that provided within a commercial airliner or the like.

It is also an object of the present invention to provide for a system for increasing the quality of audio reproduction of a stereo and binaural rendering in a multi-listener environment, as well as to provide an audio monitoring device for monitoring the quality of audio reproduction of stereo and binaural signals at an audio station.

The invention accordingly provides a method of increasing the quality of audio reproduction of a stereo rendering in a multi-listener environment having an audio system with a plurality of multi-channel listener stations, each listener station having an audio transducer interface for interconnection with an audio transducer device. The method comprising the steps of playing predetermined first and second audio test signals over respective first (L) and second (R) channels of the audio system, and interconnecting a testing apparatus in turn to the audio transducer interface of at least some of said listener stations and monitoring the audio test signals received by said audio transducer interface to identify a fault condition, on the basis of the received audio test signals.

Preferably, said monitoring of said signal includes at least two of the following:

(i) monitoring for the presence of both a left and right channel signal in said audio transducer device;

(ii) monitoring for a level imbalance between the first and second signals of said audio transducer device;

(iii) monitoring for a phase imbalance between the first and second signals of said audio transducer device;

(iv) determining whether a reversal of polarity exists between the left and right signals of said audio transducer device;

(v) determining if the first and second signals are reversed;

(vi) determining if the first and second signals include a distortion exceeding a predetermined threshold; and (vii) determining if a DC bias exceeding a predetermined threshold exists in the first or second signals;

(viii) monitoring if a noise cancelling voltage exists in the first or second signals; and (ix) determining if the first or second signals are earthed.

Conveniently, the method includes monitoring at least three, four or more of the above.

Advantageously, the first and second audio test signals are distinguishable on the basis of at least one variation to assist in analysis by the testing apparatus of the fault condition.

The variation typically involves a predetermined phase shift between the first and second audio test signals.

Conveniently, the stereo rendering is a binaural rendering, and the audio transducer interface is a speaker interface, which is typically a headphone interface.

Typically, the listener stations are seat-based and the multi-listener environment is a passenger environment.

The passenger environment may be chosen from a group including a passenger airline, a passenger vessel, a passenger train or a passenger vehicle.

Typically, the first test signal includes a first periodic tone played on the first channel and the second test signal includes a second periodic tone played on the second channel, said second periodic tone having substantially the same period as that of the first periodic tone but having a predetermined phase delay relative to the first periodic tone.

The method may further comprise the step of using the testing apparatus to analyze the phase difference between the outputted tones played on the first and second channels to determine the fault condition.

The method may still further comprise the step of delaying the phase of the tone played on one of the channels and analyzing the phase difference between the delayed tone and the tone played on the other channel to determine the fault condition.

Typically, the method comprises the step of delaying the phase of the tone played on the other channel and analyzing the phase difference between the delayed tone played on the other channel and the tone played on the one channel to determine the fault condition.

By the term "fault condition" is understood any condition which adversely affects the quality of audio reproduction of the stereo rendering in the multi-listener environment.

The invention extends to a testing system for increasing the quality of audio reproduction of a stereo rendering in a multi-listener environment, said environment having a plurality of multi-channel listener stations. Each listener station has an audio system including an audio transducer interface for interconnection with an audio transducer device. The testing system includes audio storage means for interconnection with the audio system of each listener station for the storage and playback of predetermined audio test signals over the audio system. At least one audio testing apparatus is adapted to be interconnected in turn with the audio transducer interface of each listener station to monitor the audio reproduction quality of the predetermined audio test signals and to assist in the analysis of a fault condition.

Typically, said audio storage means includes said predetermined audio signals stored in a machine readable format on a detachable storage medium inserted into a machine player which outputs first and second audio test signals to the audio system of each audio station in said multi-listener environment.

Advantageously, said testing apparatus is arranged to compare first (L) and second (R) audio test signals so as to determine at least two of:

the presence of both a left and right channel signal; the presence of a level imbalance between the left and right signals; the presence of a phase imbalance between the left and right signals of said headphones; the presence of a reversal of polarity between the left and right signals; the presence of a reversal of the left and right signals; the presence of distortion exceeding a predetermined threshold in the left or right signals; the presence of a DC bias exceeding a predetermined threshold; the presence of a noise cancelling voltage or the determination of the left or right signals being earthed.

Conveniently, said predetermined audio test signals include a first periodic tone played on a first channel and a second periodic tone played on a second channel, said second periodic tone having substantially the same period as the period of the first periodic tone but having a predetermined phase shift relative to the first periodic tone, and said testing apparatus includes a first phase detector for detecting the phase difference between said first and second tones received on said first and second channels.

The testing apparatus may include a second phase detector for comparing the phase difference between a phase delayed first channel and a second channel.

According to a still further aspect of the invention there is provided a testing apparatus for monitoring the quality of audio reproduction of stereo signals at a listener station. The device includes first and second channel inputs for receiving first (L) and second (R) stereo test signals from the listener station. Phase detection means are provided for detecting the phase differences between the left and right stereo test signals, and level detection means are used to detect the relative levels of the first and second stereo test signals. Analyzing means analyze outputs of the phase and level detection means and generate a fault type on the basis of the analysis.

Preferably, the testing apparatus includes first and second phase shifters for shifting the phases of the left and right signals to yield left and right phase shifted signals, the phase detection means comprising a first phase detector for detecting the phase differences between the left and phase shifted right signals, and a second phase detector for detecting the phase differences between the right and phase shifted left signals.

Advantageously, the apparatus includes gain control means for controlling the levels of the left and right input signals whilst preserving their amplitude ratios.

Typically, the analyzing means includes at least one look-up table for receiving and analyzing phase-related measurements constituting the outputs from the phase detection means.

Conveniently, the analyzing means includes at least one look-up table for receiving and analyzing amplitude-related measurements constituting the outputs from the level detection means.

The testing apparatus may include display means for displaying the fault types derived from the at least one look-up table, the fault types being chosen from a group including at least two of the following:

phase imbalance between the left and right test signals, level imbalance between the left and right test signals, absence of a left or right test signal, reversal, polarity reversal, distortion or DC bias above a predetermined threshold, absence of noise cancelling voltage, and earthing of the left or right test signal.

The testing apparatus may further include a connector for enabling the left and right inputs to be selectively and in turn connected to a plurality of headphone interfaces at a series of audio stations in a multi-listener environment.

According to a yet further aspect of the invention there is provided a testing apparatus for monitoring the quality of audio reproduction of a stereo rendering in a multi-listener environment having a plurality of listener stations, with each listener station having an audio system including an audio transducer interface for interconnection with an audio transducer device. The testing apparatus is adapted to be inserted in turn into the audio transducer interface of each listener station to monitor the audio reproduction quality of the audio test signals generated by audio playback means for playback over the audio system of each listener station. The testing apparatus comprises left and right inputs for receiving left and right components of the test signals from the listener station; phase detection station; phase detection means for detecting the phase differences between the left and right components of the test signals; level detection means for detecting the relative levels of the left and right components of the test signals; and analyzing means for analyzing outputs of the phase and level detection means and for generating, where present, a fault type on the basis of the analysis.

The invention still further provides a testing system for testing first (L) and second (R) channels of an audio stereo system in a multi-listener environment having a plurality of listener stations, each listener station having an audio transducer interface for interconnecting with an audio transducer device. The system includes audio storage and playback means for interconnection with the audio system of each listener station for the storage and playback of predetermined first and second test signals over the respective first and second channels of the audio system.

At least one testing apparatus is adapted to be connected in turn with the audio transducer interface of each listener station to monitor the audio reproduction quality of the predetermined audio test signals, wherein the audio playback means are arranged to generate first and second audio test signals which are distinguishable on the basis of at least one variation, and wherein said testing apparatus is arranged to detect any further variation in the first and second audio test signals, for assisting in analysis of a fault condition.

The system may include at least one phase detector for detecting the relative phases of the first and second test signals, and an analyzer responsive to the phase detector for analyzing a particular identifiable fault condition on the basis of the phase related measurement.

The identifiable fault condition may be chosen from a group including reversed polarity, reversed channels, a combination of the above two and phase imbalance, and wherein each fault condition is identifiable on the basis of a characteristic phase vector set.

According to a yet further aspect of the invention there is provided a detachable storage medium carrying in machine readable format at least first and second audio test signals arranged for playback over a machine player in a multi-listener environment. Said environment includes a plurality of multi-channel listener stations each having audio transducer interfaces, and said first and second audio test signals are arranged for receipt by a testing apparatus interconnectable to each of the audio transducer interfaces for testing the audio quality of the channels extending between the machine player and each of the audio transducer interfaces by monitoring the first and second audio test signals, wherein the first and second test signals are distinguishable on the basis of at least one variation.

Conveniently, the variation involves a predetermined phase shift between the first and second audio test signals, wherein the phase shift is arranged to allow for the analysis and distinction between a predefined series of fault conditions in the channels by the testing apparatus.

BRIEF DESCRIPTION OF THE DRAWINGS

Embodiments of the present invention will now be described with reference to the accompanying drawings in which:

FIG. 3 illustrates a flow chart of the steps that the tester of the preferred embodiment proceeds through;

FIG. 8 illustrates the phase to zone mapping process used in the preferred embodiment;

FIG. 9 illustrates a zone table for phase related measurements used in the preferred embodiment.

DETAILED DESCRIPTION OF THE EMBODIMENTS

In the preferred embodiment, a testing apparatus is provided for the automatic testing of aircraft seats for certification of a level of performance of the audio quality of each of the airline seats.

Figure 1:
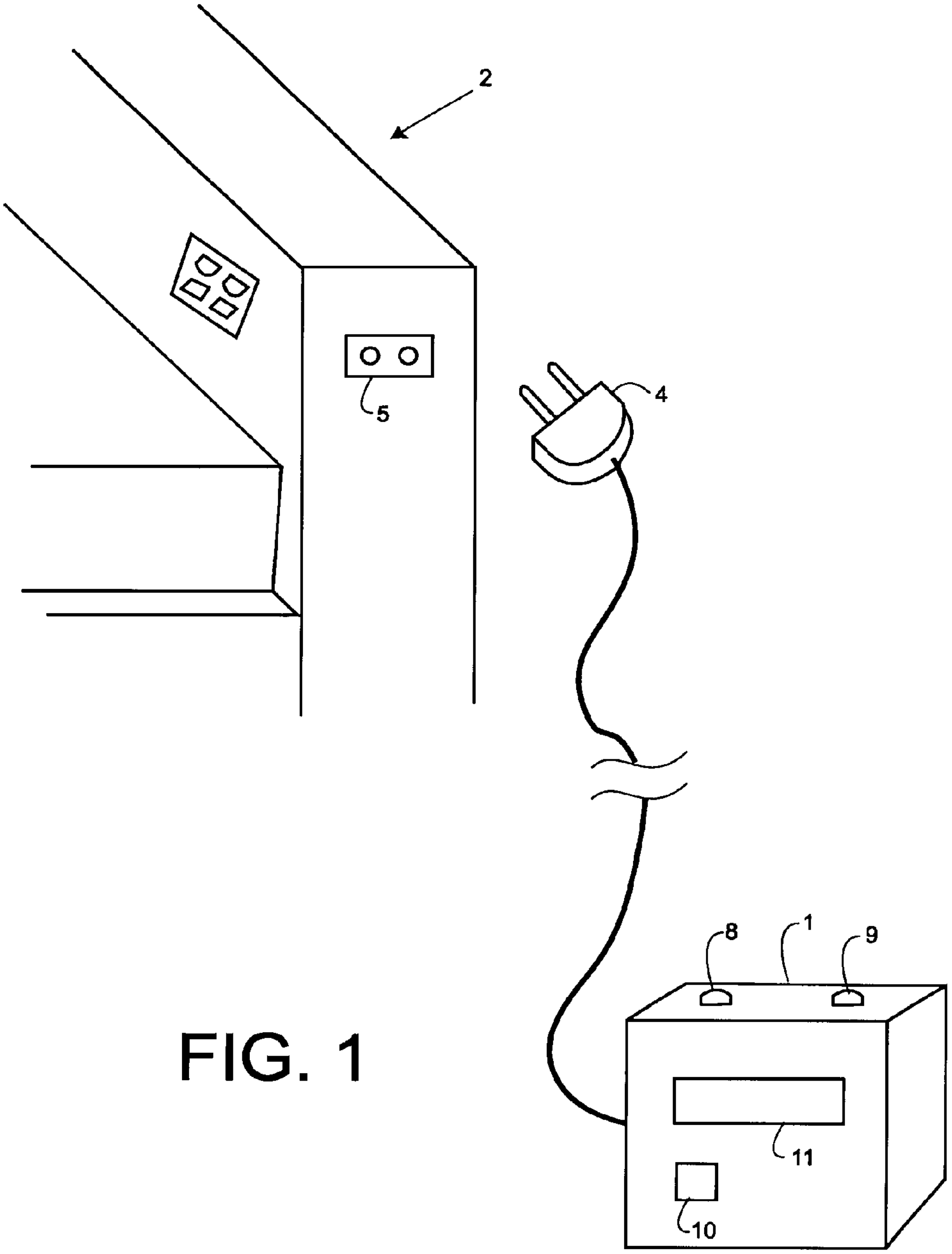
FIG. 1 illustrates a perspective view of the tester and a portion of an aircraft seat.

Turning initially to FIG. 1, there is shown an exemplary form of a tester 1 for testing airline seats 2. The tester 1 includes a headphone plug 4 for insertion into a corresponding headphone jack 5 located on the airline seat 2 via a seat-based audio system (not shown). It will be understood that the plug 4 can be adapted to suit the particular airline audio system provided. The tester 1 includes green 8 and red 9 LED's and a test button 10 in addition to an LCD display screen 11.

Figure 2:
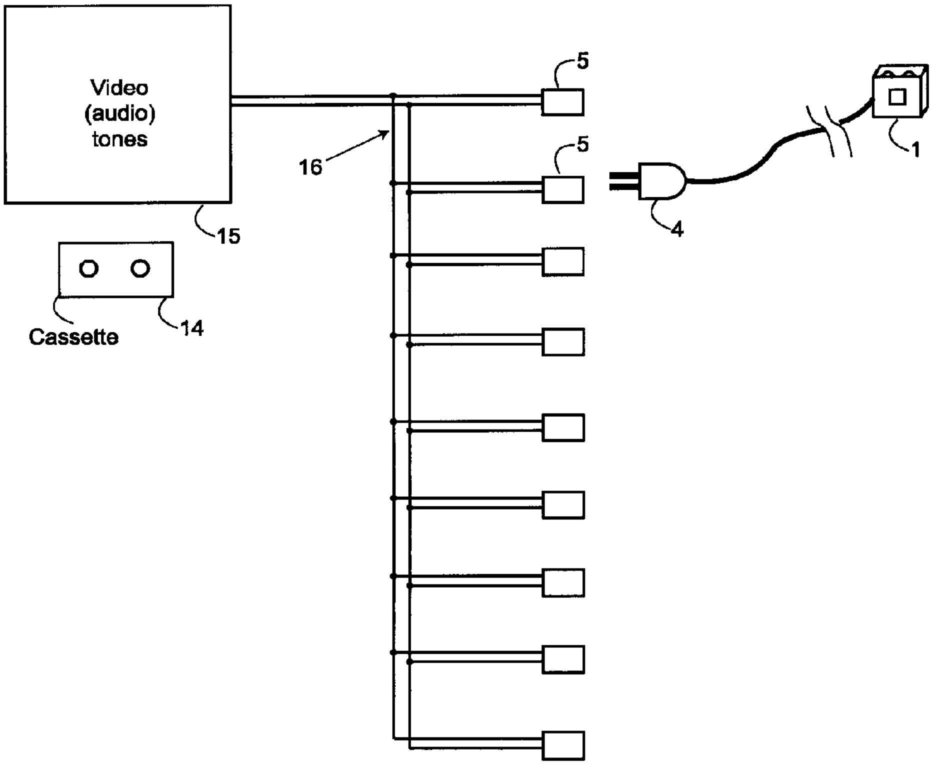
FIG. 2 illustrates schematically the distribution of audio to headphone jacks within an airline environment.

Referring now to FIG. 2, in order to utilise the tester 1, a video tape 14 carrying a series of test audio tones is loaded into the video system 15 of the aeroplane for playing a continuous series of audio tones to the audio jacks 5 of passenger seats of the aircraft via a conventional hardwired network 16. It will be appreciated that for the sake of simplicity, the hardwired network has been illustrated schematically, and does not include any details of the wiring harnesses and individual leads to each seat-based audio system. The user of the tester 1 walks around to each of the headphone jacks 5 in the aircraft testing each seat in turn and noting the results. The test signal preferably comprises a continuous sine waveform of 1 kHz for both the left and right channels. The test waveforms preferably have equal amplitudes and the waveform applied to one of the audio channels, say the left channel, is phase delayed by 45° with reference to the right channel.

Figure 3:
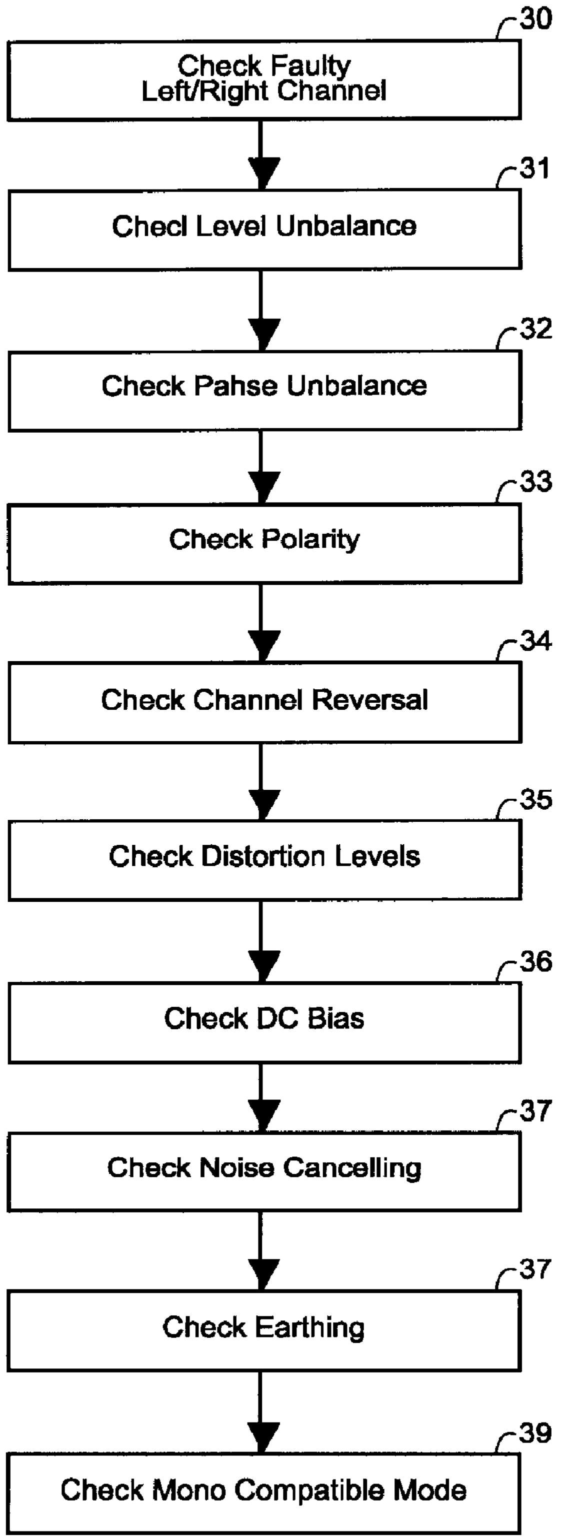
Figure 4:
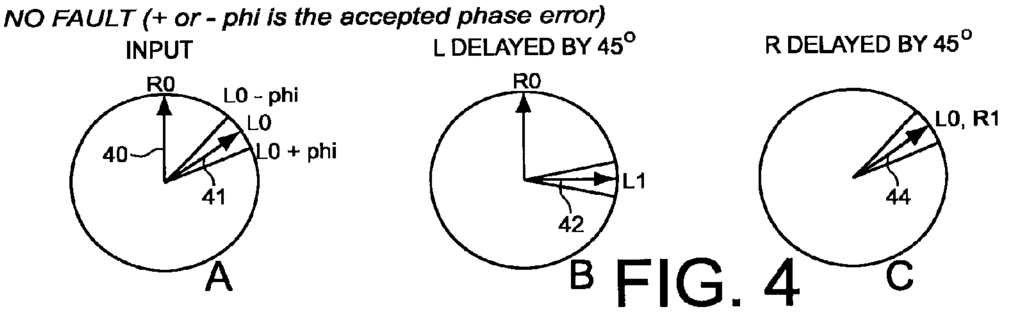
FIG. 4 illustrates a series of phase diagrams indicative of a no fault condition.

The tester carries out the tests as indicated by the flow chart in FIG. 3 which can include the following:

Check Faulty Left/Right Channel 30

The tester 1 checks for the presence of a tone on both channels. The absence of a tone on one or both channels generates a fault indication on the LCD display 11 of the instrument, with an associated code representing the nature of the fault. This fault can also be indicated if the level imbalance between channels exceeds, say, approximately 15 dB.

Check Level Imbalance 31

Undesirable effects to the passenger are likely to occur if one earphone is louder than the other, ie out of balance. The tester checks for the left and right channels to be within a 1.5 dB (16%) level of each other. This threshold can be user adjustable with 1.5 dB representing the default setting.

Check Phase Imbalance 32

The effect of phase imbalance to the passenger can be a "rotated" stereo image, which may be especially noticeable with high end headphone formats such as the 'Dolby Headphone' format. The tester measures the slight delay (microseconds) between the left and right channels and returns the value on the LCD display. If the value of the delay is greater than a user defined limit (say 50 microseconds) the red lamp 8 is illuminated as a fault indicator. This parameter can be user adjustable.

Check Polarity 33

This fault represents a reversal of polarity between the signal on the left and right channels, ie 180 degrees out of phase. This is often critical for headphone formats as they may rely on an accurate phase relationship to correctly reproduce the surround sound effect. This phenomenon also affects mono and stereo recordings to varying degrees, depending on the content.

Check Left and Right Channels Reversed 34

The tester checks the tones for the correct stereo wiring of the audio system through to the jack. The effect to the passenger of an incorrect wiring is for the left signal to emanate from the right earphone and vice versa.

Check Left and Right Distortion Levels 35

The tester detects and displays the levels of distortion for both the left and right channels. If the level exceeds a pre-determined threshold, a fault indication is returned. The distortion measurement can be implemented by means of a built-in switchable filter which allows selection of THD or THD+N measurement mode.

Check Presence of DC Bias on Left or Right Channel 36

A DC voltage on the audio output can damage headphones and also limits the audio drive available to the earphone. This can result in distortion or imbalance at listening levels. The tester 1 checks to see if either channel exhibits a DC component above a preset threshold. This measurement can also be performed without an audio tone being played over the audio system.

Check Noise Cancelling Voltage 37

When enabled, this measurement checks for the presence of a voltage at a noise cancelling socket where such a socket is provided. The absence of noise cancelling voltage generates a fault condition. This measurement can also be made without an audio tone being played over the audio system.

Check Earthing Fault 38

The tester tests for the case where the audio jack has a physical fault where the earth connection has failed.

Check Mono Compatible Mode 39

The tester can be set to "mono" mode, which disables the phase measurements, allowing mono systems to be effectively tested.

The aforementioned tests can be implemented through the processing of the phased relationship between the left and right channels to bring the relationship to either 0°, 90° or 180° by post processing of the left and right input signals in order to create a reference of orthogonal vectors. Preferably, the frequency of the sine waveform is chosen to be in the range where human hearing is most sensitive to amplitude and phase imbalanced errors. A suitable frequency was found to be about 1 kHz.

The process of analysis of the output proceeds as follows:

1. The signal L0 from channel L is also delayed by 45°, to produce the delayed signal called L1. Hence, L0 leads L1 by 45°.

2. The signal R0 from channel R is delayed by 45°, to produce the delayed signal called R1. Hence, R0 leads R1 by 45°.

3. The phase relationship between the R0, L1 pair of signals is measured by a first phase detector.

4. The phase relationship between the L0, R1 pair of signals is measured by a second phase detector.

In relation to the operation of the phase detectors, ideally they are not sensitive to the amplitude of their input signal and the output remains unchanged upon swapping the two inputs. In other words, the input (R0, L1) generates the same output as the input (L1, R0), which means that the input range can always be restricted to 0–180°. Depending on the outputs of the two phase detectors, various errors can be found.

In FIGS. 4 to 7 the relationships between the various phase vector signals are shown. For example, in FIG. 4, where no phase error exists, and the signals are R0, L1 and L0, phase vector 41 should be 45° out of phase within an accepted phase error of plus or minus PHI. Further, where L is delayed by 45°, the signal L1 having phase vector 42 should be 90° out of phase with the signal L0 having phase vector 40. Finally, the signals L0 and R1 should be aligned 44.

Figure 5:
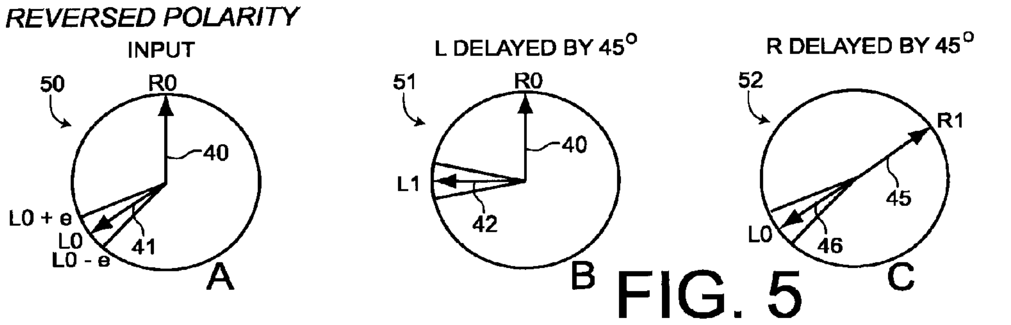
FIG. 5 illustrates a series of phase diagrams representative of a reverse polarity condition.

The phase relationship diagrams for a reversed polarity fault are illustrated at 50 to 52 in FIG. 5. In the first case 50, where the reverse polarity is present, the right channel R0 having phase vector 40 is 225° behind the phase vector 41 of the left channel L0. Next, in the phase diagram 51, the delayed left channel L1, 42 is 90° behind the right channel R0 with phase vector 40. Further, in the phase diagram 52, the delayed right channel R1 having phase vector 45 is 180° out of phase with the left channel L0 having phase vector 46.

Figure 6:
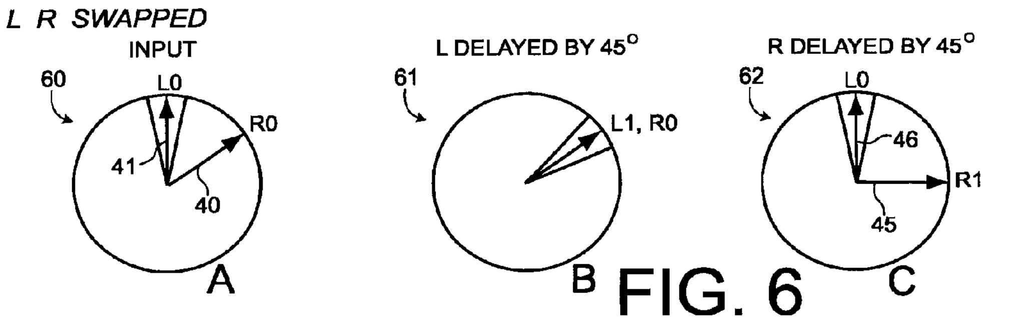
FIG. 6 illustrates a series of phase diagrams representative of a left/right swapped condition.

Turning to FIG. 6, there is illustrated a series of phase diagrams 60, 61 and 62 for the case where the left and right channels are swapped. In the first situation, the right channel R0, 41 leads the left channel R1, 42. In the second case 61, the delayed left channel L1 and right channel R0 are aligned. In the third case, the delayed right channel R1 leads the left channel L0 by 90°.

Figure 7:
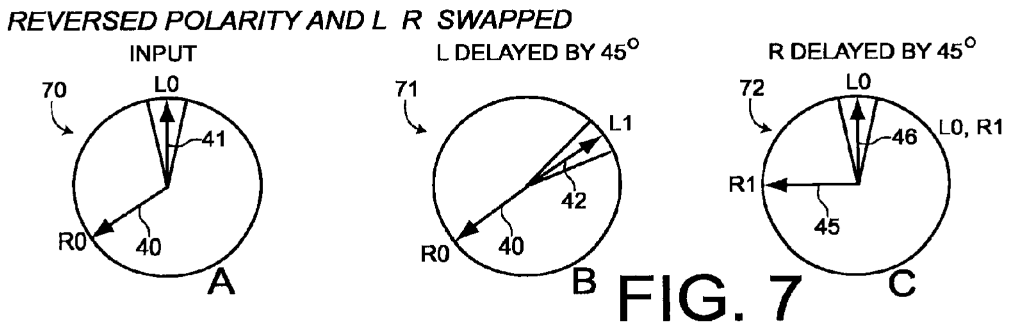
FIG. 7 illustrates a series of phase diagrams representative of reversed polarity and left/right swapped conditions.

FIG. 7 illustrates a series of phase diagrams 70, 71 and 72 for the case where there is a reversal of polarity and the left and right channels are swapped. In the first case 70, the right channel R0 having phase vector 40 leads the left channel L0, 41 by 135°. In the phase diagram 71, the right channel R0 with phase vector 40 is 180° out of phase with the left channel L0 with phase vector 42. In the next case 72, the left channel L0 with phase vector 46 leads the delayed right channel 45 by 90°.

The phase diagrams of FIG. 4 to FIG. 7 can be utilised to determine the current status of the audio system under test. As was noted previously, a first phase detector determines the phase between the right channel R0 and the delayed left channel L1. The second phase detector determines the phase relationship between the left channel L0 and the delayed right channel R1.

Turning now to FIG. 8, the output of the phase detectors 80, 81 can be divided into eight zones 82 depending on the phase of the response (amplitude of output). A measurement of the output of the zone of the two phase detectors can then be utilised to determine the type of input signal error by means of a look up table. A typical look up table is illustrated in FIG. 9 wherein, at the intersection of the two zones 91, 92, there is provided the type of output error. The type of fault will be dependent on the zone in which the output of both phase detectors is found. Once the fault has been identified, the residual phase error can be calculated and will be equal to the signal deviation from 0°, 90° or 180°, depending on the fault.

In the preferred embodiment, the output of the phase detectors is analyzed after conversion to a digital format. It has been found that an eight bit resolution was sufficient to provide for a 1° accuracy of the phase measurement. Those results which do not fall within a known zone are erroneous and may be a result of at least one of the phase shifters or detectors not functioning properly. This provides an efficient and reliable self test system for the utilised physical hardware.

Further, the level imbalance of the left and right channels is simultaneously measured by means of envelope detection that is not phase sensitive. The level of the left and right channels can be converted to a digital format and then checked. In this manner, both amplitude and phase related information which is used to detect the faults previously mentioned is available in one single measurement step through utilisation of the same test signal.

Figure 10:
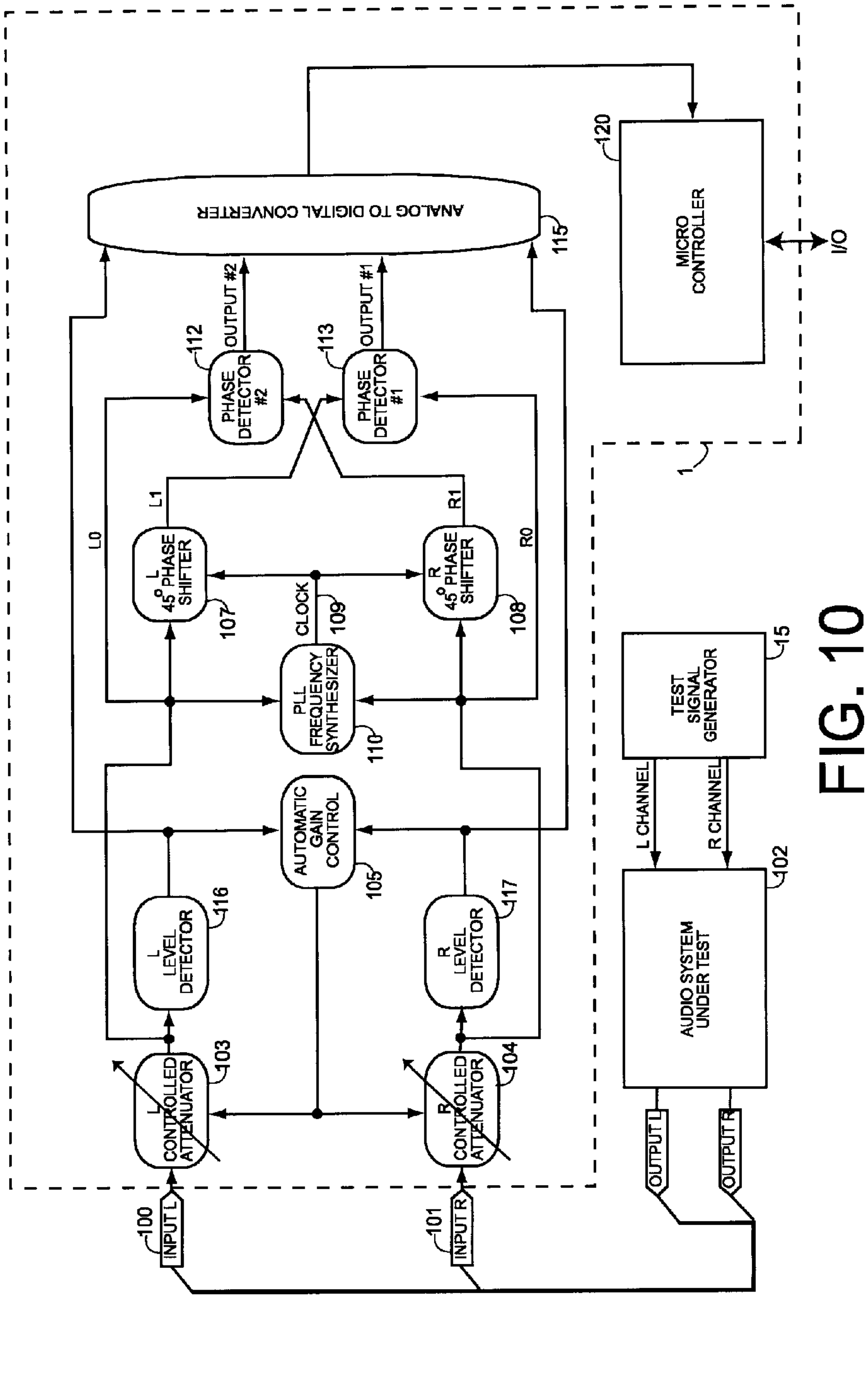
FIG. 10 illustrates schematically a functional block diagram of one form of the tester.

Turning to FIG. 10, there is shown schematically one form of design of a tester unit 1. The tester unit 1 receives inputs 100 and 101 from the audio system under test 102. Each input 100 and 101 undergoes controlled attenuation at respective left and right controlled attenuators 103 and 104 with the degree of attenuation being determined by an automatic gain control (AGC) unit 105. The AGC unit 105 acts on both attenuators 103 and 104 so as to provide an optimal signal level for subsequent processing whilst preserving the original ratio of the amplitudes of the input left and right signals. The output of the attenuators 103 and 104 is fed to phase shifters 107, 108 which are digitally tuned by a clock signal 109 having a fixed frequency relationship with the frequency of the input signal. The clock is generated by a phase locked loop synthesiser 110. This eliminates any error due to the frequency drift or fluctuations in the input signal, with the phase shifters being effectively locked to the input signal. The output of the phase shifters is fed to phase detectors 112, 113 which, in practice, can comprise a Gilbert cell or an XOR gate. The output of the phase detectors is analog to digitally converted by A/D converter 115 in addition to the level outputs from level detectors 116 and 117. The four outputs of the analog to digital converter 116 are forwarded to micro-controller 120 for look-up table analysis. The micro-controller 120 first divides the input phase into its correct zone, then a look-up table formed in accordance with FIG. 9 is used to identify the fault. When a fault occurs, the fault details are output to the screen. A measure of the residual phase error and level imbalance analysis can also be performed by the micro controller on the inputs and the results also output to the screen.

One advantage of the phase measurement aspect of the invention is that it allows for the simultaneous detection and analysis of phase related fault modes which would otherwise mask one another. In particular, L-R reverse can be detected from other phase and mono systems.

It would be appreciated by a person skilled in the art that numerous variations and/or modifications may be made to the present invention as shown in the specific embodiment without departing from the spirit or scope of the invention as broadly described. The present embodiment is, therefore, to be considered in all respects to be illustrative and not restrictive. For instance, instead of the test signals merely being phase delayed relative to one another, other distinguishable variables such as variations in frequency can be employed either with or without an additional shift in relative phase. In the broadest sense, the first and second signals need to have an identifiable difference which, when subject to a fault condition, can provide the basis for the identification and analysis of said fault condition by the testing apparatus after suitable processing.

We claim:

1. A testing apparatus for monitoring the quality of audio reproduction of stereo signals at a listener station, the device comprising:

first and second channel inputs for receiving first (L) and second (R) stereo test signals from the listener station;

phase detection means for detecting the phase differences between the left and right stereo test signals;

level detection means for detecting the relative levels of the first and second stereo test signals;

analyzing means for analyzing outputs of the phase and level detection means and for generating a fault type on the basis of the analysis; and first and second phase shifters for shifting the phases of the left and right signals to yield left and right phase shifted signals, the phase detection means comprising a first phase detector for detecting the phase differences between the left and phase shifted right signals, and a second phase detector for detecting the phase differences between the right and phase shifted left signals.

2. A testing apparatus according to claim 1 which includes gain control means for controlling the levels of the left and right input signals whilst preserving their amplitude ratios.

3. A testing apparatus according to claim 1 in which the analyzing means includes at least one look-up table for receiving and analyzing phase-related measurements constituting the outputs from the phase detection means.

4. A testing apparatus according to claim 3 in which the analyzing means includes at least one look-up table for receiving and analyzing amplitude-related measurements constituting the outputs from the level detection means.

5. A testing apparatus according to claim 4 which includes display means for displaying the fault types derived from the at least one look-up table, the fault types being chosen from a group including at least two of the following:

phase imbalance between the left and right test signals, level imbalance between the left and right test signals, absence of a left or right test signal, reversal, polarity reversal, distortion or DC bias above a predetermined threshold, absence of noise cancelling voltage, and earthing of the left or right test signal.

* * * * *